United States Patent
Roth et al.

(10) Patent No.: US 7,136,961 B2
(45) Date of Patent: Nov. 14, 2006

(54) METHOD AND APPARATUS FOR WIDE WORD DELETION IN CONTENT ADDRESSABLE MEMORIES

(75) Inventors: Alan Roth, Austin, TX (US); Robert McKenzie, Ottawa (CA); Oswald Becca, Roundrock, TX (US)

(73) Assignee: Mosaid Technologies, Inc., Kanata (CA)

( * ) Notice: Subject to any disclaimer, the term of this patent is extended or adjusted under 35 U.S.C. 154(b) by 449 days.

(21) Appl. No.: 10/357,270

(22) Filed: Jan. 31, 2003

(65) Prior Publication Data

US 2004/0093462 A1    May 13, 2004

Related U.S. Application Data

(60) Provisional application No. 60/426,321, filed on Nov. 13, 2002.

(51) Int. Cl.
G06F 12/00    (2006.01)
(52) U.S. Cl. .................. 711/108; 365/49; 365/230.01
(58) Field of Classification Search ............. 711/108, 711/214, 216; 365/49, 230.03, 230.01
See application file for complete search history.

(56) References Cited

U.S. PATENT DOCUMENTS

| | | |
|---|---|---|
| 5,440,715 A | 8/1995 | Wyland |
| 6,000,008 A | 12/1999 | Simcoe |
| 6,246,601 B1 | 6/2001 | Pereira |
| 6,522,562 B1 | 2/2003 | Foss |
| 6,560,670 B1 * | 5/2003 | Ichiriu .................. 711/108 |
| 2003/0070039 A1 | 4/2003 | Gillingham |

FOREIGN PATENT DOCUMENTS

WO    WO 01/67456 A    9/2001

OTHER PUBLICATIONS

Lin K-J, et al., A Low-Power CAM Design for LZ Data Compression, *IEE Transactions on Computers*, 49(10):1139-1145, Oct. 2000.

* cited by examiner

*Primary Examiner*—Pierre-Michel Bataille

(57) ABSTRACT

A system and method for searching and deleting segmented wide word entries in a CAM array is disclosed. A normal CAM search operation is executed to find the first word segment of a wide word. Once found, a search and delete operation is executed to find all successive word segments of the wide word, with the last word segment being marked as a deleted word segment, along a first CAM array direction. Once the last word segment is deleted, the wide word is considered to have been deleted because subsequent searches for the wide word will not find its last word segment. A purge operation is then executed along the opposite CAM array direction to delete all the word segments of the deleted wide word. Match processing circuits in each row of the CAM array can pass search results to an adjacent row above or below it to ensure that only word segments belonging to the wide word are found in the search and delete operation and deleted in the purge operation.

17 Claims, 17 Drawing Sheets

Table 1a: CAM Table with Data

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 1 | 0 | X | X | D |
| 4 | 1 | 0 | X | X | E |
| 5 | 0 | 1 | 0 | 0 | - |

Table 1b: CAM Table after step 3

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 1 | 0 | X | X | D |
| 4 | 0 | 0 | X | X | E |
| 5 | 0 | 1 | 0 | 0 | - |

Table 1c: CAM Table after one iteration of Step 4

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 0 | 0 | X | X | D |
| 4 | 0 | 0 | X | X | E |
| 5 | 0 | 1 | 0 | 0 | - |

Fig. 11

Table 1d: CAM Table after three iterations of step 4

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 0 | 0 | X | X | C |
| 3 | 0 | 0 | X | X | D |
| 4 | 0 | 0 | X | X | E |
| 5 | 0 | 1 | 0 | 0 | - |

Table 1e: CAM Table after three iterations of step 4

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 0 | 1 | 1 | 1 | B |
| 2 | 0 | 0 | X | X | C |
| 3 | 0 | 0 | X | X | D |
| 4 | 0 | 0 | X | X | E |
| 5 | 0 | 1 | 0 | 0 | - |

Table 1f: CAM Table after step 6

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 0 | 1 | 0 | 0 | B |
| 2 | 0 | 1 | 0 | 0 | C |
| 3 | 0 | 1 | 0 | 0 | D |
| 4 | 0 | 1 | 0 | 0 | E |
| 5 | 0 | 1 | 0 | 0 | - |

Fig. 12

Table 2a: CAM Table with Data

| Row | Valid Bit | Status 2 (First) | Status 1 (Last) | Status 0 | Data |
|---|---|---|---|---|---|
| 0 | 1 | 1 | 1 | X | A |
| 1 | 1 | 1 | 0 | X | B |
| 2 | 1 | 0 | 0 | X | C |
| 3 | 1 | 0 | 0 | X | D |
| 4 | 1 | 0 | 1 | X | E |
| 5 | 0 | 1 | 1 | X | - |

Table 2b: CAM Table after step 3

| Row | Valid Bit | Status 2 (First) | Status 1 (Last) | Status 0 | Data |
|---|---|---|---|---|---|
| 0 | 1 | 1 | 1 | X | A |
| 1 | 1 | 1 | 0 | X | B |
| 2 | 1 | 0 | 0 | X | C |
| 3 | 1 | 0 | 0 | X | D |
| 4 | 0 | 0 | 1 | X | E |
| 5 | 0 | 1 | 1 | X | - |

Table 2c: CAM Table after Step 4

| Row | Valid Bit | Status 2 (First) | Status 1 (Last) | Status 0 | Data |
|---|---|---|---|---|---|
| 0 | 1 | 1 | 1 | X | A |
| 1 | 1 | 1 | 0 | X | B |
| 2 | 1 | 0 | 0 | X | C |
| 3 | 1 | 0 | 0 | X | D |
| 4 | 0 | 0 | 0 | X | E |
| 5 | 0 | 1 | 1 | X | - |

Fig. 13

Table 2d: CAM Table after one iteration of step 5

| Row | Valid Bit | Status 2 (First) | Status 1 (Last) | Status 0 | Data |
|---|---|---|---|---|---|
| 0 | 1 | 1 | 1 | X | A |
| 1 | 1 | 1 | 0 | X | B |
| 2 | 1 | 0 | 0 | X | C |
| 3 | 0 | 0 | 0 | X | D |
| 4 | 0 | 0 | 0 | X | E |
| 5 | 0 | 1 | 1 | X | - |

Table 2e: CAM Table after two iterations of step 5

| Row | Valid Bit | Status 2 (First) | Status 1 (Last) | Status 0 | Data |
|---|---|---|---|---|---|
| 0 | 1 | 1 | 1 | X | A |
| 1 | 1 | 1 | 0 | X | B |
| 2 | 0 | 0 | 0 | X | C |
| 3 | 0 | 0 | 0 | X | D |
| 4 | 0 | 0 | 0 | X | E |
| 5 | 0 | 1 | 1 | X | - |

Table 2f: CAM Table after three or more iterations of step 5

| Row | Valid Bit | Status 2 (First) | Status 1 (Last) | Status 0 | Data |
|---|---|---|---|---|---|
| 0 | 1 | 1 | 1 | X | A |
| 1 | 0 | 1 | 0 | X | B |
| 2 | 0 | 0 | 0 | X | C |
| 3 | 0 | 0 | 0 | X | D |
| 4 | 0 | 0 | 0 | X | E |
| 5 | 0 | 1 | 1 | X | - |

Table 2g: CAM Table after step 7

| Row | Valid Bit | Status 2 (First) | Status 1 (Last) | Status 0 | Data |
|---|---|---|---|---|---|
| 0 | 1 | 1 | 1 | X | A |
| 1 | 0 | 1 | 1 | X | B |
| 2 | 0 | 1 | 1 | X | C |
| 3 | 0 | 1 | 1 | X | D |
| 4 | 0 | 1 | 1 | X | E |
| 5 | 0 | 1 | 1 | X | - |

Fig. 14

Table 3a: CAM Table with Data

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 1 | 0 | X | X | D |
| 4 | 1 | 0 | X | X | E |
| 5 | 0 | 1 | 0 | 0 | - |

Table 3b: CAM Table after step 3

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 1 | 0 | X | X | D |
| 4 | 0 | 0 | X | X | E |
| 5 | 0 | 1 | 0 | 0 | - |

Table 3c: CAM Table after Step 4

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 1 | 0 | X | X | C |
| 3 | 0 | 0 | X | X | D |
| 4 | 0 | 0 | X | X | E |
| 5 | 0 | 1 | 0 | 0 | - |

Fig. 15

Table 3d: CAM Table after one iteration of step 5

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 1 | 1 | 1 | 1 | B |
| 2 | 0 | 0 | X | X | C |
| 3 | 0 | 0 | X | X | D |
| 4 | 0 | 0 | X | X | E |
| 5 | 0 | 1 | 0 | 0 | - |

Table 3e: CAM Table after two iterations of step 5

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 0 | 1 | 1 | 1 | B |
| 2 | 0 | 0 | X | X | C |
| 3 | 0 | 0 | X | X | D |
| 4 | 0 | 0 | X | X | E |
| 5 | 0 | 1 | 0 | 0 | - |

Table 3f: CAM Table after step 6

| Row | Valid Bit | Status 2 (First) | Status 1 (Size 1) | Status 0 (Size 0) | Data |
|---|---|---|---|---|---|
| 0 | 1 | 1 | 0 | 0 | A |
| 1 | 0 | 1 | 1 | 1 | B |
| 2 | 0 | 1 | 0 | 0 | C |
| 3 | 0 | 1 | 0 | 0 | D |
| 4 | 0 | 1 | 0 | 0 | E |
| 5 | 0 | 1 | 0 | 0 | - |

Fig. 16

Table 4a: CAM Table with Data

| Row | Valid Bit | Status 2 (First) | Status 1 (Purge) | Status 0 | Data |
|---|---|---|---|---|---|
| 0 | 1 | 1 | 0 | X | 00A |
| 1 | 1 | 1 | 0 | X | 11B |
| 2 | 1 | 0 | 0 | X | C |
| 3 | 1 | 0 | 0 | X | D |
| 4 | 1 | 0 | 0 | X | E |
| 5 | 0 | 1 | 0 | X | - |

Table 4b: CAM Table after Step 3

| Row | Valid Bit | Status 2 (First) | Status 1 (Purge) | Status 0 | Data |
|---|---|---|---|---|---|
| 0 | 1 | 1 | 0 | X | 00A |
| 1 | 1 | 1 | 0 | X | 11B |
| 2 | 1 | 0 | 0 | X | C |
| 3 | 1 | 0 | 0 | X | D |
| 4 | 0 | 0 | 1 | X | E |
| 5 | 0 | 1 | 0 | X | - |

Table 4c: CAM Table after one iteration of Step 4

| Row | Valid Bit | Status 2 (First) | Status 1 (Purge) | Status 0 | Data |
|---|---|---|---|---|---|
| 0 | 1 | 1 | 0 | X | 00A |
| 1 | 1 | 1 | 0 | X | 11B |
| 2 | 1 | 0 | 0 | X | C |
| 3 | 0 | 0 | 1 | X | D |
| 4 | 0 | 0 | 1 | X | E |
| 5 | 0 | 1 | 0 | X | - |

Fig. 17

Table 4d: CAM Table after two iterations of Step 4

| Row | Valid Bit | Status 2 (First) | Status 1 (Purge) | Status 0 | Data |
|---|---|---|---|---|---|
| 0 | 1 | 1 | 0 | X | 00A |
| 1 | 1 | 1 | 0 | X | 11B |
| 2 | 0 | 0 | 1 | X | C |
| 3 | 0 | 0 | 1 | X | D |
| 4 | 0 | 0 | 1 | X | E |
| 5 | 0 | 1 | 0 | X | - |

Table 4e: CAM Table after three or more iterations of Step 4

| Row | Valid Bit | Status 2 (First) | Status 1 (Purge) | Status 0 | Data |
|---|---|---|---|---|---|
| 0 | 1 | 1 | 0 | X | 00A |
| 1 | 0 | 1 | 1 | X | 11B |
| 2 | 0 | 0 | 1 | X | C |
| 3 | 0 | 0 | 1 | X | D |
| 4 | 0 | 0 | 1 | X | E |
| 5 | 0 | 1 | 0 | X | - |

Table 4f: CAM Table after Step 6

| Row | Valid Bit | Status 2 (First) | Status 1 (Purge) | Status 0 | Data |
|---|---|---|---|---|---|
| 0 | 1 | 1 | 0 | X | 00A |
| 1 | 0 | 1 | 0 | X | 11B |
| 2 | 0 | 1 | 0 | X | C |
| 3 | 0 | 1 | 0 | X | D |
| 4 | 0 | 1 | 0 | X | E |
| 5 | 0 | 1 | 0 | X | - |

Fig. 18

METHOD AND APPARATUS FOR WIDE WORD DELETION IN CONTENT ADDRESSABLE MEMORIES

RELATED APPLICATION

This application claims the benefit of U.S. Provisional Application No. 60/426,321 filed on Nov. 13, 2002. The entire teachings of the above application are incorporated herein by reference.

BACKGROUND OF THE INVENTION

The present invention relates to semiconductor memory. In particular, the present invention relates to word deletion in content addressable memory. In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not.

A CAM stores data in a matrix of cells, which are typically SRAM based cells or DRAM based cells. Until recently, SRAM based CAM cells have been most common because of their simple implementation. However, to provide ternary state CAMs, i.e. where each CAM cell can store one of three values: a logic "0", "1" or "don't care" result, ternary SRAM based cells typically require many more transistors than ternary DRAM based cells. As a result, ternary SRAM based CAMs have a much lower packing density than ternary DRAM based cells.

A typical CAM block diagram is shown in FIG. 1. The CAM 10 includes a matrix, or array 25, of DRAM based CAM cells (not shown) arranged in rows and columns. An array of DRAM based ternary CAM cells have the advantage of occupying significantly less silicon area than their SRAM based counterparts. A predetermined number of CAM cells in a row store a word of data. An address decoder 17 is used to select any row within the CAM array 25 to allow data to be written into or read out of the selected row. Data access circuitry such as bitlines and column selection devices, are located within the array 25 to transfer data into and out of the array 25. Located within CAM array 25 for each row of CAM cells are matchline sense circuits, which are not shown, and are used during search-and-compare operations for outputting a result indicating a successful or unsuccessful match of a search word against the stored word in the row. The results for all rows are processed by the priority encoder 22 to output the address (Match Address) corresponding to the location of a matched word. The match address is stored in match address registers 18 before being output by the match address output block 19. Data is written into array 25 through the data I/O block 11 and the various data registers 15. Data is read out from the array 25 through the data output register 23 and the data I/O block 11. Other components of the CAM include the control circuit block 12, the flag logic block 13, the voltage supply generation block 14, various control and address registers 16, refresh counter 20 and JTAG block 21.

FIG. 2 shows a typical ternary DRAM type CAM cell 30 as described in issued U.S. Pat. No. 6,320,777 B1. DRAM CAM Cell 30 has a comparison circuit which includes an n-channel search transistor 32 connected in series with an n-channel compare transistor 34 between a matchline ML and a tail line TL. A search line SL* is connected to the gate of search transistor 32. The storage circuit includes an n-channel access transistor 36 having a gate connected to a wordline WL and connected in series with storage capacitor 38 between bitline BL and a cell plate voltage potential VCP. Charge storage node CELL1 is connected to the gate of compare transistor 34 to turn on transistor 34 if there is charge stored on capacitor 38 representative of a logic "1" state. The remaining transistors and capacitor mirror transistors 32, 34, and 36 and capacitor 38 for the other half of the ternary data bit, and are connected to corresponding lines SL and BL* and are provided to support ternary data storage. Together they can store a ternary value representing logic "1", logic "0", or "don't care". Table 1 below shows the possible ternary states cell 30 can assume.

TABLE 1

| Ternary Value | CELL1 | CELL2 |
| --- | --- | --- |
| 0 | 0 | 1 |
| 1 | 1 | 0 |
| "Don't Care" | 0 | 0 |

The tail line TL is typically connected to ground and all the transistors are n-channel transistors. The description of the operation of the ternary DRAM cell is detailed in the aforementioned issued patent U.S. Pat. No. 6,320,777 B1.

Another commonly used type of memory cell is a binary cell as shown in FIG. 3. Binary CAM cell 40 is identical to ternary cell 30 of FIG. 2 except that a latching storage element is used instead of a pair of DRAM storage cells. While search transistor 42, compare transistor 44 and access transistor 46 correspond to transistors 32, 34 and 36 respectively, a first inverter 48 and a second inverter 50 are arranged in a cross-coupled configuration. The input of inverter 48 is connected to the gate of compare transistor 44 and a source/drain terminal of access transistor 46. The input of inverter 50 is thus connected to the same transistors of the duplicate half of cell 40. Binary cell 40 is well known in the art, and is essentially an SRAM cell with two pairs of search and compare transistors connected to the complementary terminals of the cross-coupled inverters.

CAMs are designed to allow very fast searching of large amounts of data, organized as words. Active CAMs in networking systems typically spend 90% of their time executing searches and 10% of the time executing table maintenance functions. Table maintenance includes writing new entries and deleting old entries from the memory array.

CAMs typically store data in 72 bit or 144 bit segments called words, where each word is stored on a single row of cells within the CAM array. However there is a developing need to store larger increments of data such as 288 bit and 432 bit words. Since it may not be practical to fabricate CAM memory arrays with 288 or 432 bit rows, these wide words are stored in multiple consecutive rows. For example, to store a 288 bit word in a CAM array with a row size of 72 bits would require four consecutive rows. Storing and searching wide words in multiple of rows can be done without significant overhead over searching normal sized words. However, deleting wide word entries can consume a large number of cycles.

Prior art CAMs disclosed in U.S. Pat. No. 6,246,601 (Pereira et al.) or U.S. patent application Ser. No. 09/997,296 (Gillingham) assigned to Mosaid Technologies Inc. can each store and search for wide words in an efficient manner. However deleting or purging those entries cannot be performed in an efficient manner. In the Pereira et al. CAM system, the system controller first has to search for the location of the wide word entry. The system controller would have to wait for the search result before calculating the location of the first word. A delete command is then issued for that word and then all subsequent segments that make up the wide word. Because a CAM only provides the highest priority match address, copies of the deleted wide word can still reside in the CAM array. Therefore, the system controller would have to repeat the search to ensure that no other copies of the wide word have been stored. In a case where there are 100 wide words each consisting of 4 word segments to be deleted, at least 1200 cycles will be required to delete all 100 wide words. More specifically, four cycles are required to search for each wide word, four cycles each to delete the wide word and four more to search the CAM again to ensure all copies of that wide word were deleted.

Hence if table maintenance operations consume too many cycles of the CAM device, then its search performance is degraded as these cycles are not available for executing search operations. Therefore the overhead for deleting wide words stored in multiple segments is significant in prior art CAM devices. Therefore to increase overall CAM performance, the number of CAM cycles required for table maintenance operations should be minimized.

Therefore, there is a need for a CAM that can efficiently search and delete wide word entries.

SUMMARY OF THE INVENTION

It is an object of the present invention to obviate or mitigate at least one disadvantage of previous CAM arrays. In particular, it is an object of the invention to provide a CAM array that minimizes the number of operation cycles required for finding and deleting wide words stored in the CAM array.

In a first aspect, the present invention provides a content addressable memory. The content addressable memory includes a matchline row and a match processing circuit. The matchline row includes data bit cells and control cells coupled to a matchline for providing a search result corresponding to a match state of the matchline. The match processing circuit receives the search result and an adjacently latched search result from an adjacent match processing circuit for providing an output, for setting the control cells to predetermined logic states in response to the adjacently latched search result corresponding to the match state.

According to an embodiment of the first aspect, each control cell includes a set circuit coupled to a content addressable memory cell, the set circuit receives set signals and the output of the match processing circuit for setting the logic state of the content addressable memory cell when the set signals are at predetermined logic states.

In another embodiment of the first aspect, the match processing circuit includes a flip-flop circuit for receiving the search result at its D-input, for providing the latched search result from its Q-output in response to a clock pulse. In an aspect of the present embodiment, the match processing circuit includes a first logic pass gate for passing the search result to the flip-flop circuit when the adjacently latched search result corresponds to the match state, a second logic pass gate for passing the latched search result to the adjacent match processing circuit in response to a first pass enable signal, and a third logic pass gate for passing the latched search result to another adjacent match processing circuit in response to a second pass enable signal. In yet another aspect of the present embodiment, the third logic pass gate selectively passes one of the latched search result and the adjacently latched search result from the adjacent row to the control cells in response to a second pass enable signal.

In a second aspect, the present invention provides a method for deleting a wide word from a CAM memory array. The method includes iteratively searching the CAM memory array for word segments of the wide word, marking a last word segment of the wide word, and deleting all word segments belonging to the marked wide word having the marked last word segment.

In an embodiment of the second aspect, the step of iteratively searching includes passing latched search results from one row to an adjacent row in a first direction, the step of marking includes setting a valid bit associated with the last word segment of the wide word to a logic state indicative of invalid data, and the step of deleting includes searching for the valid bit having the logic state indicative of invalid data. In an aspect of the present embodiment, the step of searching for valid bits includes passing latched search results from one row to an adjacent row in a second direction opposite to the first direction.

In a third aspect, the present invention provides a content addressable memory. The content addressable memory includes an array of content addressable memory cells, where the array includes a matchline row having data bit cells and control cells coupled to a matchline for providing a search result corresponding to a match state of the matchline, and a match processing circuit for receiving the search result and an adjacently latched search result from an adjacent match processing circuit for providing an output for setting the control cells to predetermined logic states in response to the adjacently latched search result corresponding to the match state. The content addressable memory further includes an address decoder for addressing the data bit cells and the control cells, write data circuitry for writing data to the data bit cells and the control cells, and search data circuitry for writing search data onto searchlines.

According to an embodiment of the third aspect, each control cell includes a set circuit coupled to a content addressable memory cell, the set circuit receives set signals and the output of the match processing circuit for setting the logic state of the content addressable memory cell when the set signals are at predetermined logic states.

In another embodiment of the third aspect, the match processing circuit includes a flip-flop circuit for receiving the search result at its D-input, for providing the latched search result from its Q-output in response to a clock pulse. In an aspect of the present embodiment, the match processing circuit includes a first logic pass gate for passing the search result to the flip-flop circuit when the adjacently latched search result corresponds to the match state, a second logic pass gate for passing the latched search result to the adjacent match processing circuit in response to a first pass enable signal, and a third logic pass gate for passing the latched search result to another adjacent match processing circuit in response to a second pass enable signal. In yet another aspect of the present embodiment, the third logic pass gate selectively passes one of the latched search result and the adjacently latched search result from the adjacent row to the control cells in response to a second pass enable signal.

BRIEF DESCRIPTION OF THE DRAWINGS

Embodiments of the present invention will now be described, by way of example only, with reference to the attached Figures, wherein:

FIGS. 11 and 12 show tables 1*a* to 1*f* illustrating an example of a search and delete operation;

FIGS. 13 and 14 show tables 2*a* to 2*g* illustrating an example of a search and delete operation;

FIGS. 15 and 16 show tables 3*a* to 3*f* illustrating an example of a search and delete operation; and, FIGS. 17 and 18 show tables 4*a* to 4*f* illustrating an example of a search and delete operation.

DETAILED DESCRIPTION OF THE INVENTION

A system and method for deleting segmented wide word entries in a CAM array is disclosed. A normal CAM search operation is iteratively executed to find the word segments of a wide word in a first CAM array direction. Since the CAM knows how many word segments make up the word, the search for the last word segment is a search and delete operation to mark the last word segment as a deleted word segment. Once the last word segment is deleted, the wide word is considered to have been deleted because subsequent searches for the wide word will not find its last word segment. A purge operation is then executed in the opposite CAM array direction to delete all the word segments of the deleted wide word. The system will then be able to use these word segments to store new data. Match processing circuits in each row of the CAM array can pass search results to an adjacent row above or below it to ensure that only word segments belonging to the wide word are found in the search and delete operation and deleted in the purge operation.

Figure 4:
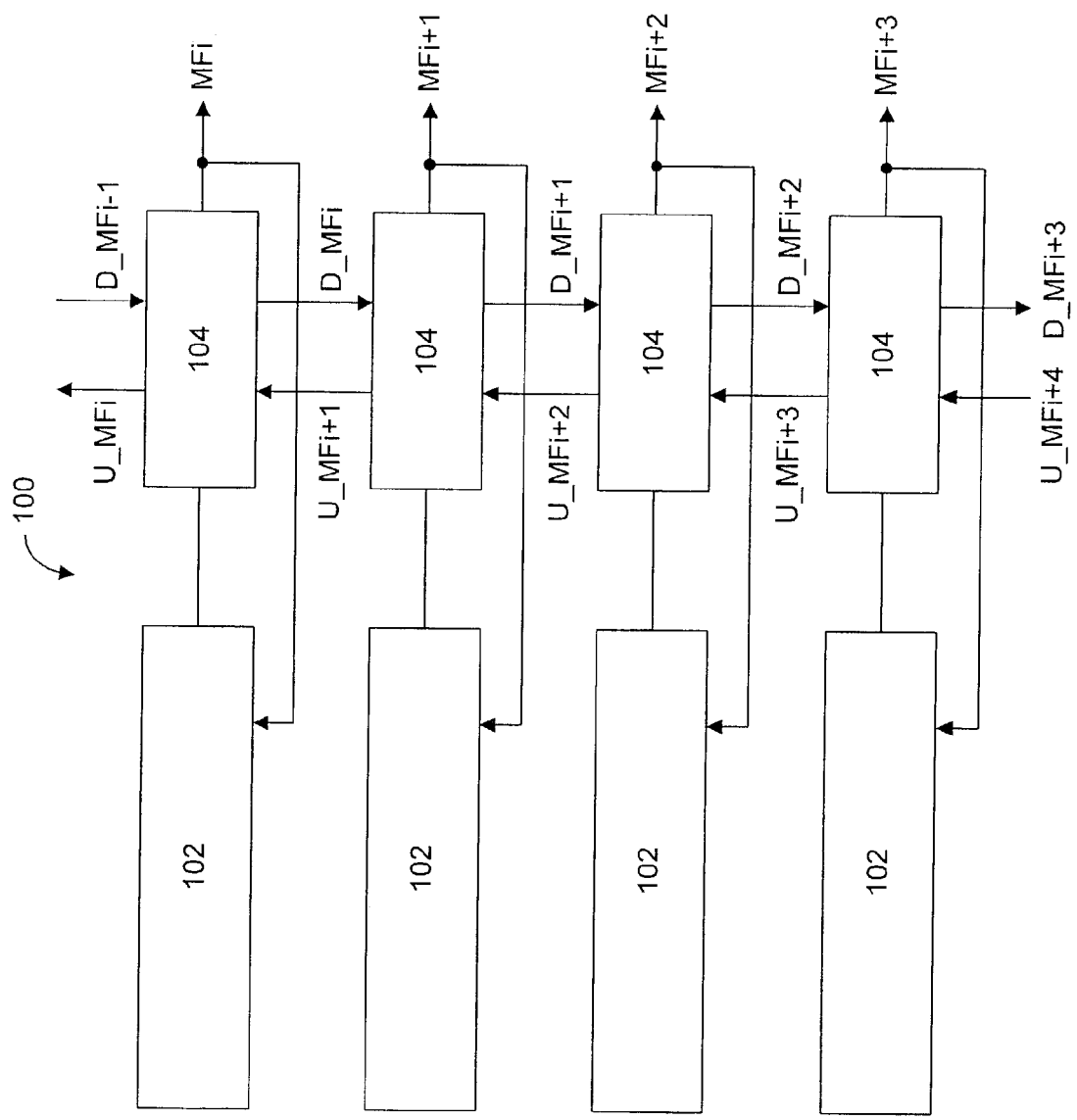
FIG. 4 is a block diagram of a CAM memory array according to a first embodiment of the present invention.

FIG. 4 is a block diagram illustrating a first embodiment of the present invention, where the arrows indicate the directional flow of data. Four rows are shown in FIG. 4, where each row of CAM array 100 includes a plurality of matchline rows 102, and a match processing circuit 104. Each matchline row 102 includes CAM data cells and CAM control cells connected to a common matchline. The CAM control cells can include any number of status bit cells and a valid bit cell, that receive an output from match processing circuit 104, such as the latched search result signal fed-back from the match processing circuit 104. The status bit and valid bit CAM cells are identical to each other, but different than the CAM data cells, as will be shown later in FIG. 7. The CAM data cells can be any type of CAM cell, such as a ternary, binary, SRAM or DRAM based CAM cell. Match processing circuit 104 can receive latched search results from either the adjacent upper row or the adjacent lower row, and send its latched search result to either an adjacent upper row or an adjacent lower row. In the present embodiment, an upper row has a lower physical address than a lower row. For example, the match processing circuit 104 of the top-most row provides a latched search result MFi corresponding to the search signal provided by the matchline row 102, and gated versions of MFi labeled U_MFi and D_MFi to respective upper and lower row match processing circuits. All match flag signals MF are received by a priority encoder for subsequent address generation. The top-most match processing circuit 104 further receives gated latched search results D_MFi−1 and U_MFi+1 from respective upper and lower row match processing circuits. CAM array 100 can store words of normal length having a width equal to the number of CAM data cells within one row, or wide words having a width equal to at least two rows of CAM data cells. Hence, a wide word comprises of word segments, and each segment is stored in one row of CAM cells.

The general method for deleting wide words of the CAM array 100 shown in FIG. 4 is now described. The matchline row 102 can be searched via searchlines (not shown), and the result of the search appears on the common matchline as a current or a voltage. A sense amplifier circuit within block 102 detects either a voltage or current upon the matchline to provide a search signal that corresponds to either a match or mismatch condition. Matchline sensing and matchline sense amplifiers are well known in the art and those of skill in the art will understand how matchline sensing can be performed. Each match processing circuit 104 receives directional control signals (not shown) for determining the direction the gated latched search results are to flow. For example, all match processing circuits can pass their latched search results to an upper row, or they can pass their latched search results to a lower row. Every search cycle consists of two phases. The first is the search and evaluate phase in which search data is asserted onto the search lines, the matchlines are sensed by the sense amplifiers, and the search result from the sense amplifiers are compared to the gated latched search results from either an upper or lower adjacent match processing circuit. The second is the latching phase where search results are latched and driven onto respective MF lines. The purpose for passing and receiving latched search results between rows is to permit an adjacent row to properly identify a word segment that belongs to the wide word being searched.

An example of the operation of CAM array 100 follows. In the present example, it is assumed that a wide word comprising two word segments are successively stored within the first two rows of CAM array 100 in FIG. 4. In the search cycle for the first word segment of a NORMAL SEARCH operation, the directional control signals are disabled and the sense amplifier of the first row provides a search result to its match processing circuit 104 in the search and evaluation phase. The NORMAL SEARCH operation is also executed during CAM search operations. The first match processing circuit will then latch and drive MFi to a state corresponding to a match in response to a clock pulse in the latching phase. Now a SEARCH AND DELETE operation begins for finding the last word segment of the wide word and marking it as deleted. In the search cycle for the second (last) word segment, the directional control signal for passing the latched MFi down to the adjacent row via D_MFi is activated. Hence D_MFi, which was latched from the previous search cycle, is passed to the match processing circuit 104 of the second row. In the search and evaluation phase of the second search operation, a match is found in the second row, and its sense amplifier of block 102 provides a search result to its match processing circuit 104. The second match processing circuit compares its search result to D_MFi at the end of the search and evaluation phase, with the search result of the second row being latched and driven to the match state in the latching phase, only if the search result of the second row and D_MFi correspond to the match state. Because the second row contains the last word segment, it is marked for deletion in response to the feedback of MFi+1. Naturally, because the first row will not match the search data for the second segment, its match processing circuit will latch and drive MFi to a mis-match state at the same time MFi+1 is latched and driven to the match state. Now a PURGE operation for deleting all the word segments can proceed in the opposite direction by activating the directional control signal for passing U_MFi+1 up to the match processing circuit 104 of the top row. Eventually, the first row is marked as deleted in response to the feedback of MFi.

The example above assumed that the first segment of the wide word was stored in the top-most row. If on the other hand the first segment was stored in the second row, then the directional control signal for passing the latched MFi+1 signal up to the adjacent row via U_MFi+1 would be activated. In summary, the process for deleting a wide word starts with a NORMAL SEARCH operation to identify the first word segment of a wide word. In the NORMAL SEARCH operation, the latched search result from one row is passed to the next adjacent row. The NORMAL SEARCH operation can include several search cycles where latched search results successively propagate through the rows, depending on the number of word segments of the wide word. The SEARCH AND DELETE operation is identical to a search cycle of the NORMAL SEARCH operation, but finds the last word segment of the wide word and marks it as deleted using the feedback of its latched search result to set one or more specific control bits associated with the word segment. Finally, the PURGE operation finds the last word segment that was marked as deleted and then successively marks the previous word segments as deleted. The PURGE operation is similar to the SEARCH AND DELETE operation as a word segment is marked as deleted in each search cycle.

Figure 5:
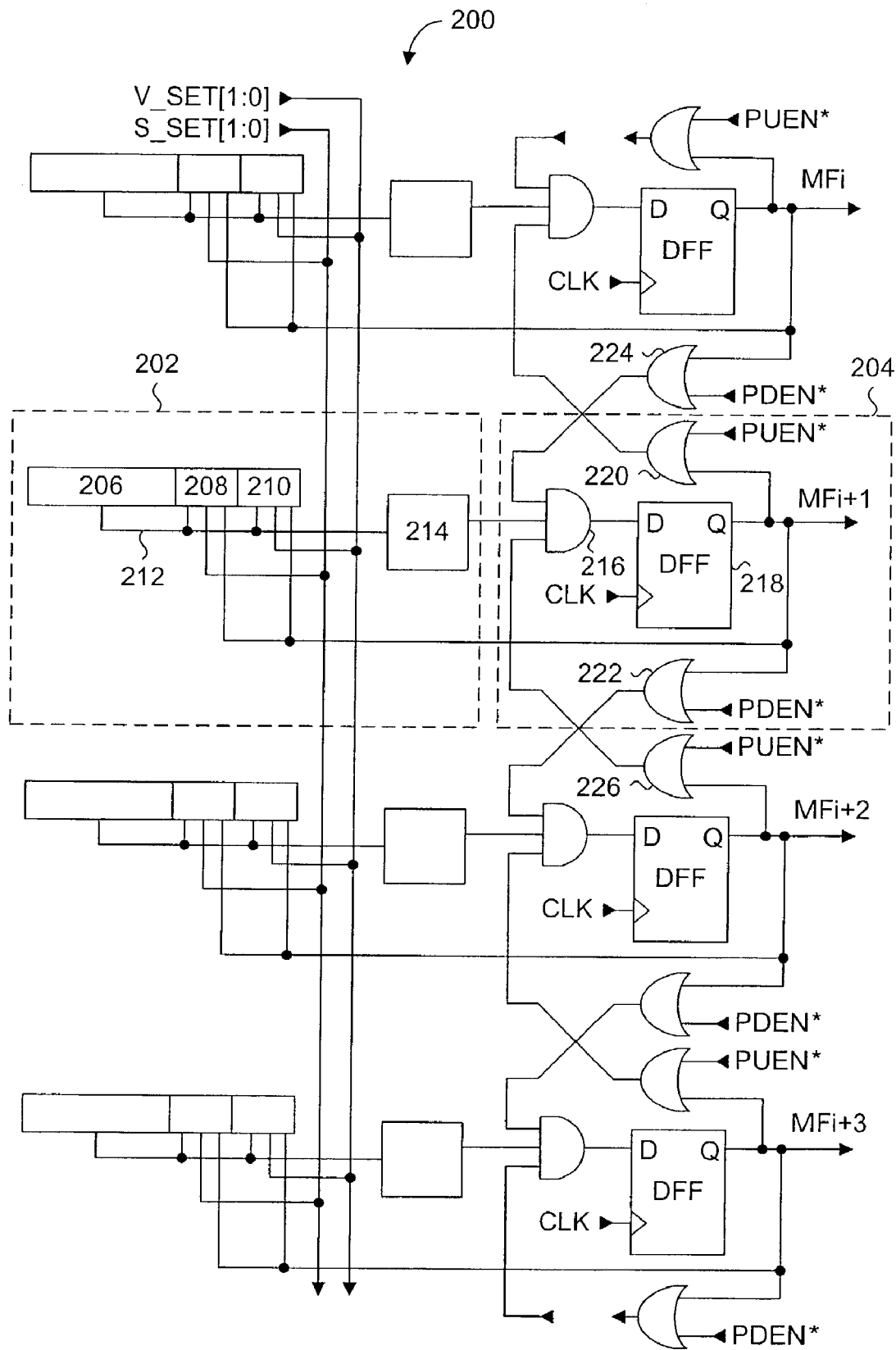
FIG. 5 is a circuit schematic of a CAM memory array according to an embodiment of the present invention.
Figure 7:
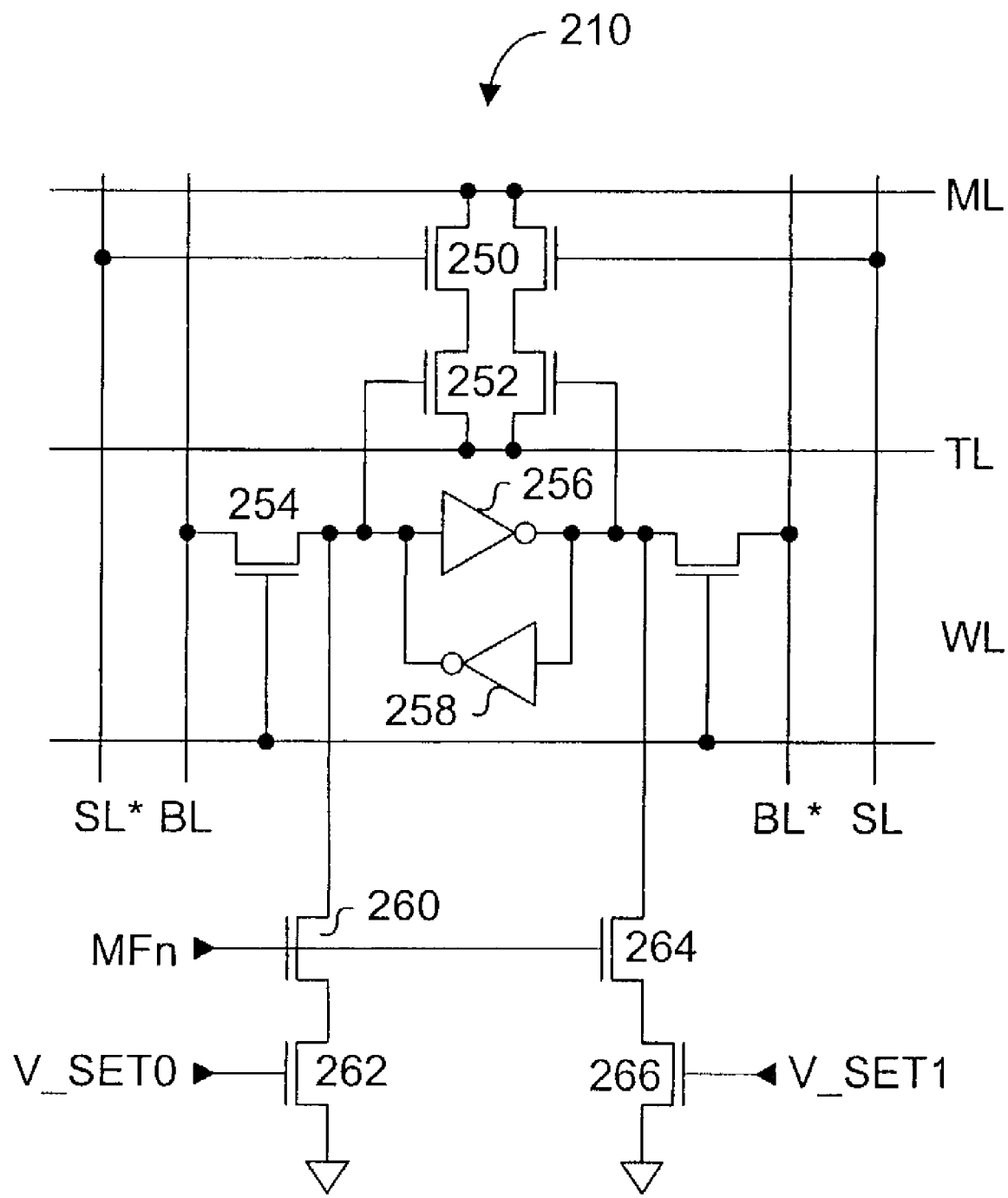
FIG. 7 is a circuit schematic of a CAM status/valid bit cell according to an embodiment of the present invention.

A detailed circuit embodiment of CAM array 100 of FIG. 4 is shown in FIG. 5 according to a second embodiment of the present invention. CAM array 200 shows four rows of CAM cells and associated match processing circuits. Only the second row from the top of FIG. 5 is described in detail since all the rows are identical to each other. Each row includes a matchline row 202 and a match processing block 204, where blocks 202 and 204 perform the same function as blocks 102 and 104 previously described for FIG. 4 respectively. Matchline row 202 includes a plurality of CAM data cells 206, a status bit cell 208 and a valid bit cell 210. In the present embodiment, status bit cell 208 and valid bit cell 210 are the CAM control cells. Bitlines, wordlines and searchlines are not shown in FIG. 5 to simplify the schematic, but those of skill in the art will understand that these lines are required for proper operation of the CAM array. As previously mentioned, the status bit cell 208 and the valid bit cell 210 are identical to each other, but different from the CAM data cells 206. A circuit schematic of status bit cell 208 is shown in FIG. 7. A common matchline 212 is connected in parallel to CAM cells 206, 208, 210 and matchline sense amplifier 214. Matchline sense amplifier 214 preferably includes a latch circuit, and provides a search result to match processing circuit 204. Status bit cell 208 receives a pair of status set signals S_SET[1:0] and valid bit cell 210 receives a pair of valid set signals V_SET[1:0]. Both cells 208 and 210 receive an output from match processing circuit 204, such as MFi+1 from match processing circuit 204. S_SET[1:0] and V_SET[1:0] are connected in common to all status bit cells and valid bit cells, respectively, in the CAM array. Connection details of S_SET[1:0] and V_SET[1:0] to their CAM cells are shown in FIG. 7.

Match processing circuit 204 includes an AND logic pass gate 216, a flip-flop 218, and OR logic pass gates 220 and 222. AND gate 216 receives the search result from sense amplifier 214 and the outputs of OR logic pass gates 224 and 226 from adjacent match processing circuits, and provides its logic result to the D-input of flip-flop 218. Logic pass gates 224 and 226 pass adjacently latched search results from the adjacent match processing circuits. Flip-flop 218 latches the logic state appearing on its D-input and drives the latched logic state on its Q-output in response to a CLK pulse. OR gate 220 receives the Q-output of flip-flop 218, labeled MFi+1, and pass up enable signal PUEN*. The output of OR gate 220 is provided to an AND gate of the match processing circuit above match processing circuit 204. OR gate 222 receives the Q-output of flip-flop 218, and pass down enable signal PDEN*. The output of OR gate 222 is provided to an AND gate of the match processing circuit below match processing circuit 204. As can be seen in FIG. 5, the components of each row are identical to each other, as are the interconnections between adjacent matchline processing circuits.

Figure 1:
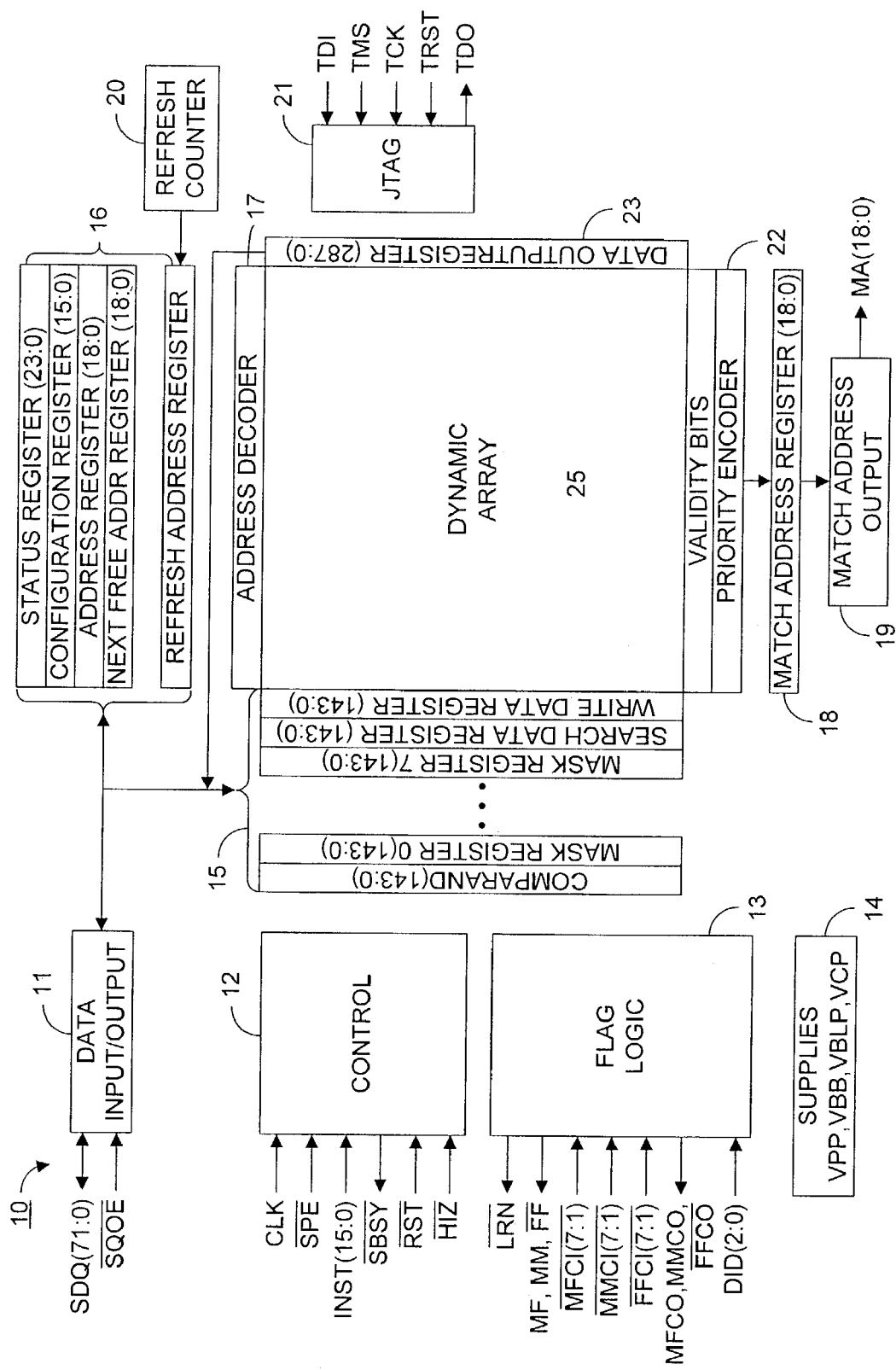
FIG. 1 is a block diagram of a conventional CAM device.
Figure 2:
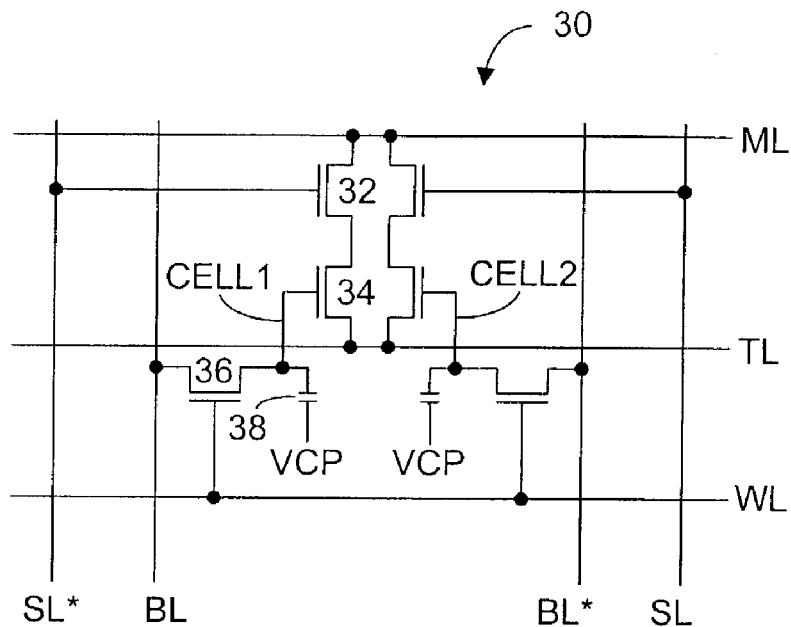
FIG. 2 is a circuit schematic of a DRAM based CAM cell.
Figure 3:
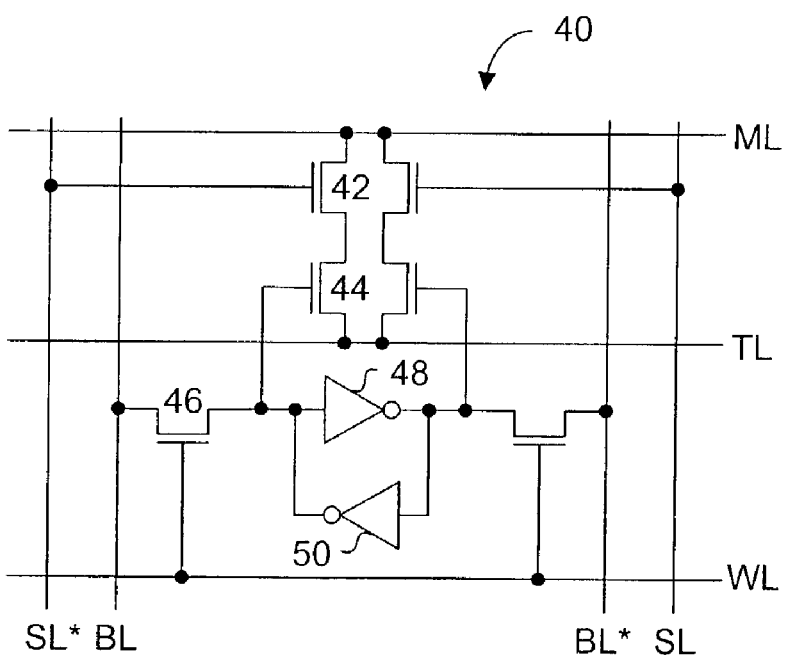
FIG. 3 is a circuit schematic of a binary CAM cell.
Figure 6:
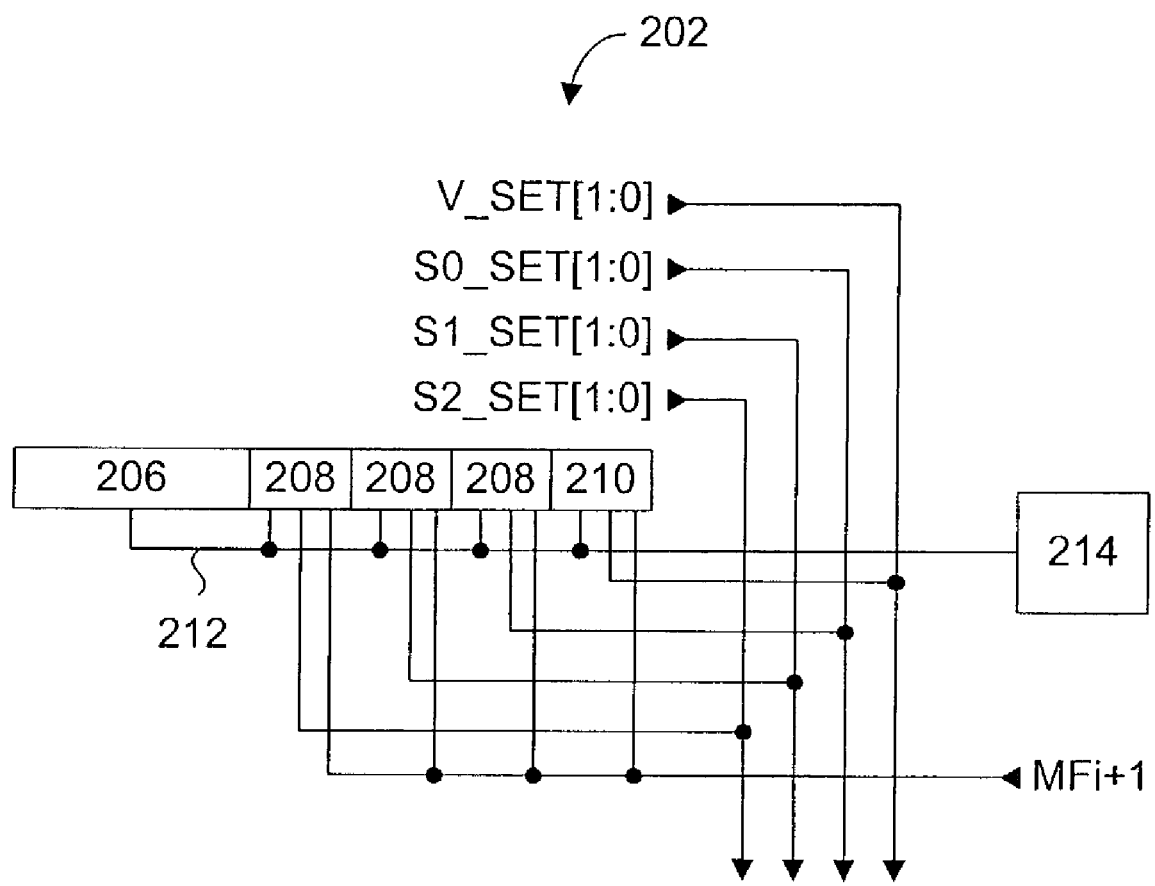
FIG. 6 is a circuit schematic of a matchline row according a preferred embodiment of the present invention.

A discussion of the matchline row 202 follows. Data cells 206 can be either binary or ternary CAM cells of the SRAM or DRAM type, as shown in FIGS. 2 and 3. While one status bit cell 208 is shown in FIG. 5, at least three status bit cells are preferably used. In such a configuration, each status bit cell 208 is configured as shown in FIG. 5, but receives its own pair of status set signals. Further details of this preferred embodiment is shown in FIG. 6. The status bit data stored in the status bit cells 208 can be used for many purposes, such as for marking user specific information about the word. They can also be used to mark the age of a word or to partition the data entries, for example. According to an aspect of the embodiments of the present invention, one status bit cell is used to mark the first word and one status bit is used to mark the last word. Both of these status bits are used in each word segment of the wide word. In another aspect, one status bit is used to mark the location of the first word segment and one or more status bits in that first word segment are used to identify the length of the word segment. In another aspect, the bits used for identifying the length of the word segment are stored in the data cells 206 and not in the status bit cells 208. The valid bit cell 210 is used to determine the rows of cells that contain valid data. It is noted that the data bit cells 206, status bit cells 208 and valid bit cells 210 along the same row share a common wordline and a common matchline 212. During a SEARCH AND DELETE operation, the stored state of the status bit cells 208 and valid bit cell 210 can be set in response to the Q-output of its respective flip-flop when their respective S_SET[1:0] and V_SET[1:0] signals are appropriately set. More specifically, the status set signals and the valid set signals can be driven to predetermined logic states during the SEARCH AND DELETE operation, the state of the status bit cells 208 and valid bit cell 210 can be set or reset when its corresponding match signal, MFi+1 for example, is at a logic state corresponding to a match condition. According to the embodiments of the present invention, the set state of cells 208 and 210 is a logic "0" and the reset state of cells 208 and 210 is a logic "1". By resetting the valid bit for example, the associated word segment is effectively deleted from the CAM array. Therefore the row can automatically remove its word segment entry from the CAM array in a single search cycle if a match is found between the search data and the data stored in its data bit cells 206 or status bit cells 208. An advantage of this architecture is that it permits multiple matching rows to simultaneously remove their word segment entries from the CAM array.

A discussion of the match processing circuit 204 follows. AND gate 216 functions as a pass gate for passing the search result from matchline sense amplifier 214 only when the outputs from OR logic pass gates 224 and 226 are at the high logic state. During normal search operations signals PUEN* and PDEN* are at the high logic state, and AND gate 216 is enabled to pass the search result to the D-input of flip-flop 218. OR gates 220, 222, 224 and 226 also function as pass gates for their respective latched search results provided by flip-flops 218. OR gates 220, 226 and any corresponding OR gate from the other match processing circuits pass the latched search result of their associated row to an adjacent match processing circuit above it when PUEN* is at the active low logic state. Correspondingly, OR gates 222, 224 and any corresponding OR gate from the other match processing circuits pass the latched search result of their associated row to an adjacent match processing circuit below it when PDEN* is at the active low logic state. This allows one match processing circuit to combine the search result of a current search cycle with the search result of a previous search cycle from an adjacent match processing circuit. For example, if the adjacently latched search result passed by either OR gate 224 or 226 is at the high logic state, AND gate 216 then passes a high logic state from sense amplifier 214. CLK is timed to pulse after AND gate 216 evaluates the search results, therefore latched search results provided by flip-flops 218 remain available for evaluation by AND gates 216. In use, only one of PUEN* and PDEN* is set to the active low logic state during any search and/or search and delete cycle. The next search and/or search and delete cycle can commence after CLK pulses and the search result from AND gate 216 is latched by flip-flop 218. One who is skilled in the art can appreciate that there are other ways to advantageously use the ability to pass search results from one adjacent row to the next.

FIG. 6 illustrates the matchline row 202 according to a preferred embodiment of the present invention. Matchline row 202 of FIG. 6 is identical to the matchline row 202 in FIG. 5, but has additional status bit cells 208 for a total of three status bit cells. As shown in FIG. 6, each status bit cell receives its own set signals, and is coupled to the matchline 212. The first status bit cell receives S0_SET[1:0], the second status bit cell receives S1_SET[1:0], and the third status bit cell receives S2_SET[1:0]. Although only three status bit cells 208 and one valid bit cell 210 is shown, any number of status bit cells and valid bit cells can be used to provide further user defined functions.

As previously mentioned, the status cell bits 208 and valid cell bit 210 can be set or reset to predetermined logic states in response to an output from match processing circuit 204. In the presently preferred embodiment, this output is the latched search result from flip-flop 218. They may also be written to and/or read from in the normal manner using the bitlines. FIG. 7 shows a circuit schematic of a status bit cell 208 or a valid bit cell 210 according to an embodiment of the present invention. The schematic of FIG. 7 will now be described in the context as a valid bit cell. Valid bit cell 210 is identical to binary CAM cell 40 shown in FIG. 3, except for the additional set circuit coupled to it. Transistors 250, 252, 254 and inverters 256 and 258 correspond to transistors 42, 44, 46, and inverters 48 and 50 of FIG. 3 respectively. Because binary CAM cell 40 has been previously described, it is not necessary to describe the function of transistors 250, 252, 254 and inverters 256 and 258 of FIG. 7. The set circuit includes n-channel transistors 260, 262, 264 and 266, where a first branch consisting of transistors 260 and 262 is serially connected between the input node of inverter 256 and ground, and similarly, a second branch consisting of transistors 264 and 266 is serially connected between the input node of inverter 258 and ground. The gate terminals of transistors 260 and 264 are connected to MFn, which can be the Q-output of a corresponding flip-flop 218 from FIG. 5. The gate terminal of transistor 262 receives signal V_SET0 and the gate terminal transistor 264 receives signal V_SET1. Signals V_SET0 and V_SET1 are the individual signals from the signal line labeled V_SET[1:0]. The latch circuit consisting of inverters 256 and 258 stores a logic "0" when the input of inverter 256 is a logic "0", and stores a logic "1" when the input of inverter 256 is a logic "1".

In an alternate embodiment, p-channel transistors can replace the n-channel transistors of the set circuit, and the first and second branches couple the same input nodes to a VDD power supply instead of ground. Furthermore, the logic states defining a set or reset state of the cell can be inverted in alternate embodiments. In operation, the state of valid bit cell 210 can be changed when MFn is at the high logic state, or a logic "1", and V_SET0 and V_SET1 are set to the appropriate logic states. In the NORMAL SEARCH operation, V_SET0 and V_SET1 are both set to the low logic state of "0", to disable the feedback effect of MFn upon the status bit cells 208 and valid bit cell 210. In the SEARCH AND DELETE operation, and the PURGE operation, V_SET0 and V_SET1 are set to complementary logic states such that one of transistors 262 and 266 are turned on. If MFn is driven to a high logic state by a corresponding flip-flop 218, then a path to ground is formed through the first or second branch of the set circuit at either the output of inverter 256 or inverter 258. Because the current through transistors 260, 262, 264 and 266 is set to be greater than the drive capability of inverters 256 and 258, any logic state latched by inverters 256 and 258 can be overwritten. Of course, if MFn remains at the inactive low logic state, then no path to ground is formed and the latched state of inverters 256 and 258 is retained. As mentioned above, the cell shown in FIG. 7 can be used as a status bit cell 208, in which set signals V_SET0 and V_SET1 are replaced by set signals S_SET0 and S_SET1 respectively. The set signals for setting or resetting the status bit cells 208 can be activated in the SEARCH AND DELETE and the PURGE operations, and in conjunction with activation of the set signals for the valid bit cell 210, if so desired.

Figure 8:
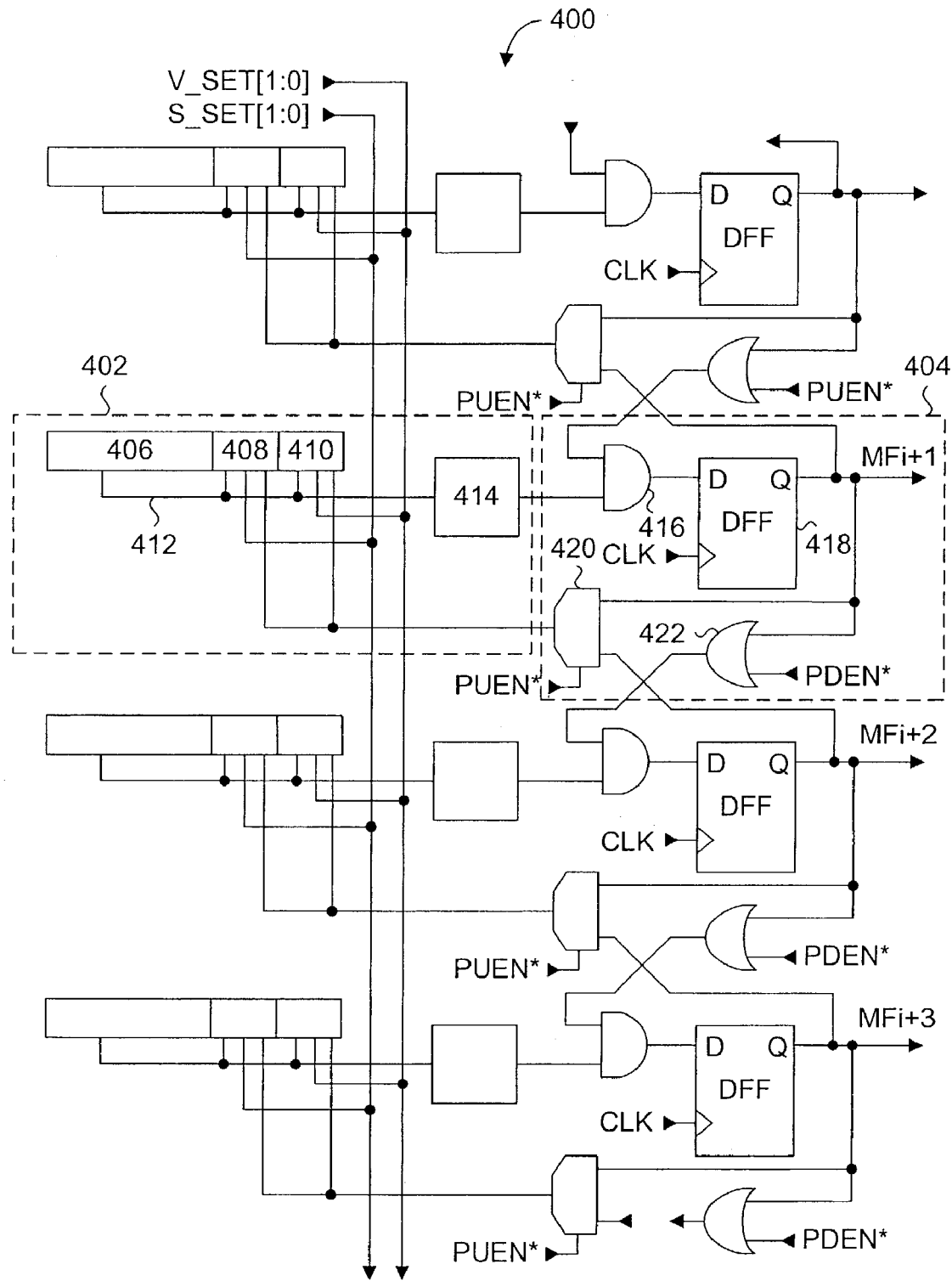
FIG. 8 is a circuit schematic of a CAM memory array according to an embodiment of the present invention.

In an alternate CAM array embodiment of the present invention shown in FIG. 8, the states of the status bit cells and valid bit cells of a row can be changed by its respective MF output, or the MF output of an adjacent row. CAM array 400 is similar to CAM array 200 of FIG. 5, in that each row includes a matchline row 402 connected to a match processing block 404. Matchline row 402 is identical to block 204 of FIG. 5, and includes CAM data cells 406, status bit cells 408 and a valid bit cell 410 connected to a common matchline 412 for sensing by sense amplifier 414. Control signals S_SET[1:0] and V_SET[1:0] are connected to the status bit cells 408 and valid bit cell 410 in the same manner as previously discussed with respect to FIGS. 5 and 7. Because components 402 to 414 and their interconnections correspond to that of like numbered components 202 to 214 of FIG. 5 respectively, there is no further need to discuss them. Preferably, matchline row 402 can include at least three status bit cells 408 as shown for matchline row 202 in FIG. 6.

Although match processing block 404 still provides an output for changing the logic states of the control cells, it differs from match processing block 204 of FIG. 5. While flip-flop 418 and OR gate 422 correspond respectively to flip-flop 218 and OR gate 222 of FIG. 5, a different type of pass logic gate replaces OR gate 220, and AND gate 416 receives two inputs instead of the three received by AND gate 216. This pass gate can be a MUX 420 controlled by PUEN* to selectively enable the adjacently latched MF search result from the row under it to be passed to its status bit cells 408 and valid bit cell 410. A first input of MUX 420 receives MFi+1 and a second input of MUX 420 receives MFi+2 from the adjacent row below. The output of MUX 420 is the output of match processing block 204 that is received by the status bit cells 408 and the valid bit cell 410. AND gate 416 has a first input for receiving the output of OR gate 422 from the row above and a second input for receiving the search result provided by sense amplifier 414.

The operation of MUX 420 is as follows. When PUEN* is at the high logic state, MUX 420 passes the latched search result of its respective row, MFi+1, to the status bit cells 408 and valid bit cell 410. When PUEN* is at the low logic state, MUX 420 passes the latched search result of the row below it, MFi+2, to the status bit cells 408 and valid bit cell 410. Hence, a match processing block 404 of a particular row can selectively receive the search result of a row below it for setting or resetting its status bit cells 408 and valid bit cell 410. Alternatively, those of skill in the art can easily see that the MF signals of each row can be multiplexed with the next row below it instead of above it, thus enabling a match in one row to set the status bit and valid bit cells of the adjacent row below it. Further alternate embodiments can include any combination of MUX circuits for passing search results in either direction.

Figure 9:
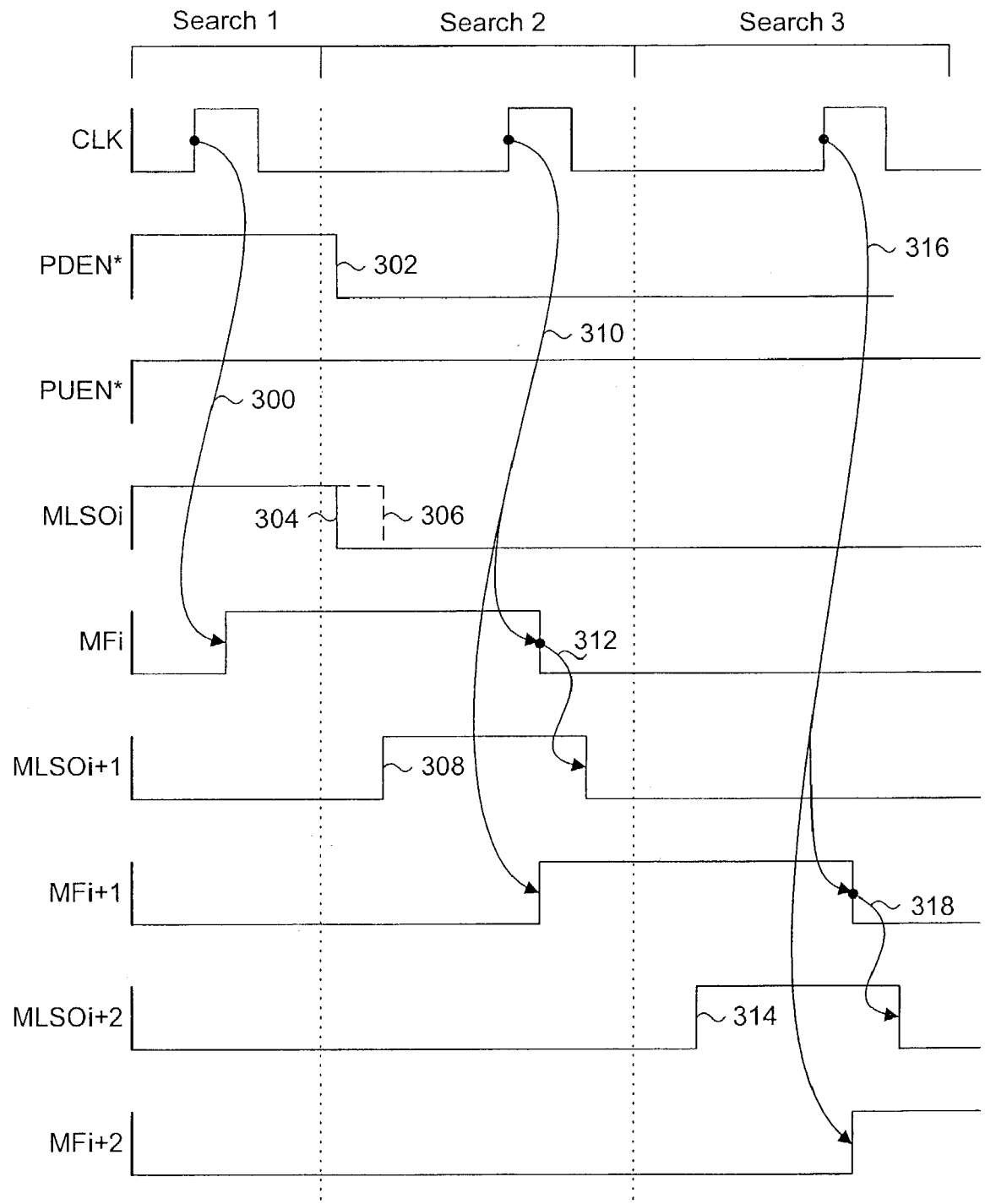
FIG. 9 is a sequence diagram illustrating the operation of the CAM memory arrays of FIG. 5 and FIG. 8.

The sequence diagram of FIG. 9 illustrates the operation of either CAM array 200 of FIG. 5 or CAM array 400 of FIG. 8. More specifically, a wide word NORMAL SEARCH operation is shown in the sequence diagram of FIG. 5 to illustrate interactions between the signals of adjacent rows. According to the embodiments of the present invention, set signals S_SET[1:0] and V_SET[1:0] remain in their inactive states during the search cycles of the NORMAL SEARCH operation. The sequence diagram of FIG. 9 shows traces for signals CLK, PDEN*, PUEN*, MLSOi to MLSOi+2, and MFi to MFi+2. The MLSO nodes are taken from the outputs of each match processing block AND gate 216 or 416, and labeled to correspond with a respective MF signal.

It is assumed in the present example that a wide word, comprising four word segments, are stored in the four matchline rows 202 shown in FIG. 5. More specifically, the first word segment is stored in the top-most row, with successive word segments stored in the following higher physical row addresses. It is further assumed that the valid bit cells 210 are set to a high logic state to indicate the presence of valid data in the row, and the status bit cells 208 are set to high logic states according to user requirements. With reference to FIG. 7, a stored high logic state is attained when the output of inverter 258 drives the input of inverter 256 to the high logic state.

In the present example, the search will identify the first word segment of the wide word and then proceed with searches for the subsequent word segments in a downward direction, or a direction of decreasing physical row address. The search will include the comparand data, the valid bit data, and status bit data. Comparand data is stored in CAM data cells 206, the valid bit data is stored in the valid bit cell 210. The status bit data, such as a first word flag bit and word length bits are stored in status bit cells 208. Thus a matchline will only report a match, or positive search result, if the valid flag is set, the first word flag is set, the word length bits match and the comparand data matches the CAM data cell contents.

In the first search cycle indicated as "Search 1" in FIG. 9, PDEN* and PUEN* are set to the inactive high logic state and search data is asserted onto the searchlines coupled to the data bit cells 206, status bit cells 208 and valid bit cells 210 of the CAM array. In the present embodiment the matchline is precharged to a high logic state, or a match condition, and discharged to a low logic state if any cell of the row reports a mismatch. Naturally, the matchline can be precharged to the low logic state and pulled to the high logic state in alternate embodiments. With PDEN* and PUEN* at the high logic state as shown at the beginning of search cycle 1, the AND gate of the first row is enabled to pass the search result from its sense amplifier 214. MLSOi is thus driven to the high logic state to indicate a match condition on its corresponding match line. Since the other word segments do not match the current search data, their MLSO nodes remain at the low logic state to indicate a mismatch condition on their corresponding match lines. CLK eventually pulses to the high logic state at first transition arrow 300 and all flip-flops 218 latch and drive the logic state of their respective MLSO nodes onto their MF lines. MFi is accordingly driven to the high logic state in the first search cycle at first transition arrow 300. Because a high logic state of MFi is fed-back to the status bit cells 208 and the valid bit cell 210, transistors 260 and 264 of the cells are turned on. All of the S_SET[1:0] and V_SET[1:0] signals are low as this is part of a NORMAL SEARCH operation, therefore none of the status or valid bits in this row will be changed.

After the first CLK pulse ends in the first search cycle, new search data is asserted to commence the second search cycle. This second search cycle is a combined search so PDEN* is driven to the active low logic state at transition 302 to enable all OR gates 224. In the first row, AND gate 216 drives MLSOi to the low logic state at transition 304 because the adjacently latched search result MFi−1 of the previous row is assumed to be at the low logic state, which is passed to the first row AND gate 216 via the previous rows' OR gate 224. On the other hand, if MFi−1 happens to be at the high logic state, then MLSOi will fall the low logic state at transition 306 illustrated by dashed lines when its sense amplifier 214 provides a mismatching search result to AND gate 216.

After PDEN* drops to the low logic state, OR gate 224 receiving MFi passes the high logic state of MFi to the AND gate 216 of the second row. AND gate 216 of the second row is therefore enabled to pass the logic state of its associated sense amplifier 214. Eventually the sense amplifier 214 of the second row provides a matching search result, and MLSOi+1 is driven to the high logic as shown at transition 308. It is noted that since all the matchlines are identically timed, transition 308 of MLSOi+1 occurs at about the same time as transition 306 of MLSOi.

At second transition arrow 310, CLK pulses high during the second search cycle to drive MFi+1 to the high logic state since MLSOi+1 is currently at the high logic state. Once again, the status bit cells 208 and the valid bit cell 210 of the second row receive the high logic state of MFi+1. MFi is driven to the low logic state at the same time MLSOi+1 is driven to the high logic state because MLSOi is currently at the low logic state. However, the low logic state of MFi eventually propagates through an OR gate 224 and an AND gate 216 to drive MLSOi+1 to a low logic state at third transition arrow 312. The sufficient propagation delay ensures that the high logic state of MLSOi+1 is latched in its flip-flop 218 before it is driven to the low logic state, and additional delay can be added as necessary.

MLSOi+2 rises to the high logic state at transition 314 in response to search data of the third search cycle while PDEN* remains at the low logic state and MFi+1 is at the high logic state. In particular, OR gate 222 of the second row passes MFi+1 to enable the AND gate 216 of the third row for passing the search result of sense amplifier 214. When CLK pulses at fourth transition arrow 316, MLSOi+2 is latched and MFi+2 is driven to the high logic state. At about the same time, MFi+1 is driven to the low logic state because MLSOi+1 is at the low logic state. At fifth transition arrow 318, MLSOi+2 drops to the low logic state in the same manner that MLSOi+1 dropped to the low logic state at third transition arrow 312.

Although not shown in FIG. 9, a subsequent search cycle in a SEARCH AND DELETE operation for the fourth and last row will produce signal trace patterns for MFi+2, MLSOi+3 and MFi+3 that are the same as the signal trace patterns for MFi+1, MLSOi+2 and MFi+2 in the third search cycle. However, because this is the SEARCH AND DELETE operation, the set signals for the status bit cells 208 and the valid bit cells 210 can be activated. For example, if V_SET0 was set to the high logic state to turn on transistor 262, the output of inverter 258 is grounded to set the state of the valid bit cell 210 to the logic "0" reset state. This marks the last word segment as invalid. Subsequent searches (which only search for valid words (i.e. the valid bit is set to "1" in the search key) will not get a match result on this row. A search for a wide word must have matches for all word segments in order to report a match for the entire wide word. Therefore marking the last word segment as invalid effectively deletes the entire wide word. The current example uses logic "1" in the valid bit to indicate that the row contains valid data. Alternate embodiments may use logic "0" to indicate that the row contains valid data. Logic "1" in the valid bit would indicate the row is empty in these alternate embodiments.

A following PURGE operation searches for the deleted last word segments and executes a series of search cycles in the opposite direction. These search cycles will proceed in the same manner as shown in FIG. 9, but with different search key data and with PUEN* set low and PDEN* set high. For example, once the last deleted word segment is found, subsequent search cycles can look for and delete adjacent word segments having valid bits in the set state. Because these search cycles proceed in the opposite direction, only the word segments belonging to the marked wide word will be found. Multiple wide words may be purged at the same time.

A variety of wide word deletion methods for execution upon CAM array 200 of FIG. 5 and CAM array 400 of FIG. 8 are now discussed. The general wide word deletion method according to an embodiment of the present invention is shown in FIG. 10.

Figure 10:
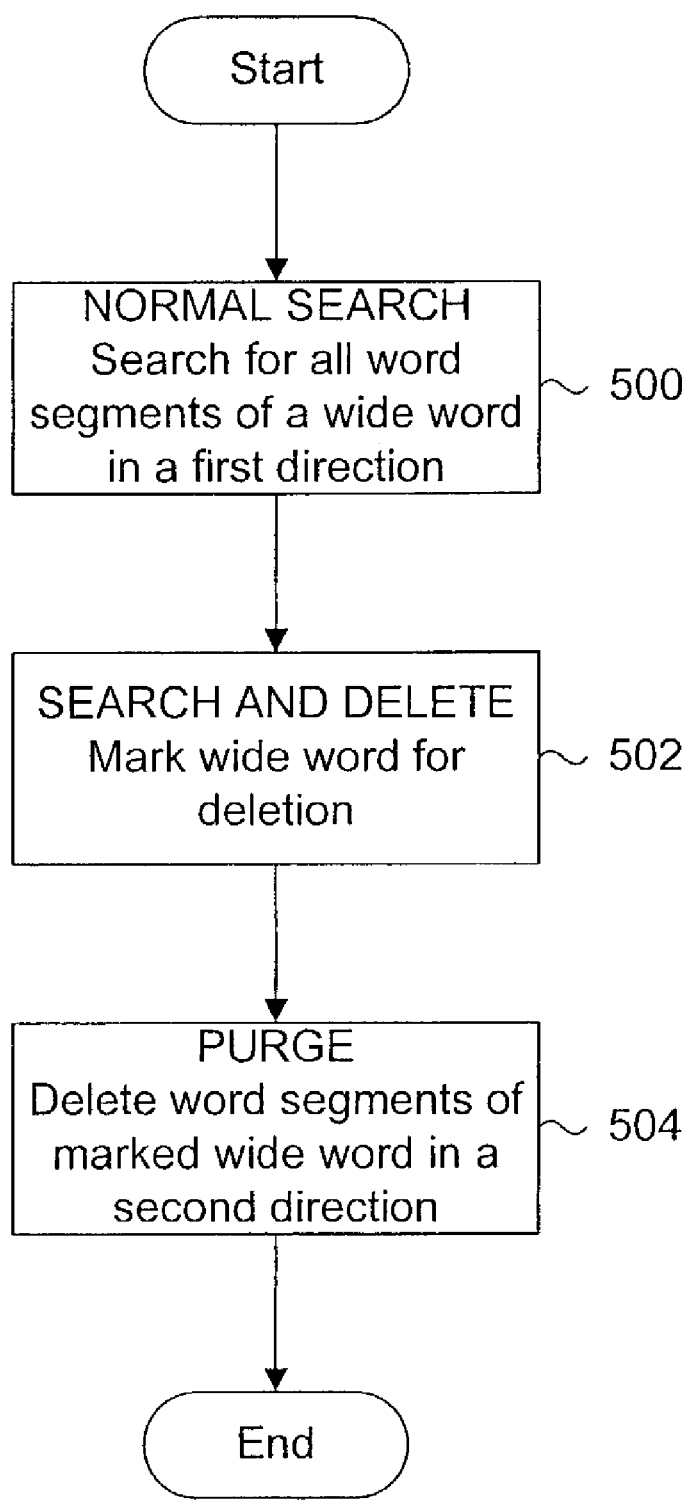
FIG. 10 is a flow chart showing a wide word deletion method according to an embodiment of the present invention.

The general wide word deletion method of FIG. 10 starts at step 500 where the CAM system iteratively searches for each word segment of a wide word in the NORMAL SEARCH operation. An example of such an iterative search was previously shown and described with reference to FIG. 9. The search can also proceed in either an increasing or decreasing physical row address direction. In step 502, the last word segment of the wide word is found in the SEARCH AND DELETE operation and marked by setting the states of either the status bit cells, valid bit cell or even the data cells, to a preset logic state in response to its latched search result. In a preferred embodiment, the valid bit is reset to a logic state representing invalid data as the method for marking the wide word. Of course, those of skill in the art will understand that any combination of data cells, status bit cells and the valid bit cell can be used for marking the row. The PURGE operation proceeds in step 504, where the CAM system searches for the marked last word segment and then iteratively deletes the remaining wide word segments in the opposite direction used in step 500. Eventually all the valid bits of the word segments of the marked wide word are reset.

The method shown in FIG. 10 can efficiently search for and delete wide words in the CAM array because multiple copies of the same wide word can be simultaneously found and deleted. Alternatively, the method can delete many different wide words each having different numbers of word segments, at the same time. In this alternative embodiment, the CAM system loops back to step 500 after step 502 in order to find another wide word. Therefore after a number of loops, many different wide words will have their last word segments marked, indicating that these wide words are deleted. Once all the desired wide words have been marked as deleted, the PURGE operation can proceed in step 504 for simultaneous deletion of all word segments belonging to the deleted wide words. Specific embodiments of the wide word deletion method shown in FIG. 10 now follow.

A definition of terms used in the specific embodiments follows. A "Search Next" instruction may only be issued if a normal search instruction has already been issued. A "Search Next" instruction combines the current search results with the latched search results of the previous search cycle. A "Search Next Down" instruction will result in signal PDEN* being driven low and a given row will only report a match to the priority encoder if its matchline row reports a match result and the row immediately above it reported a match result on the previous cycle.

Similarly, a "Search Next Up" instruction will result in signal PUEN* being brought low. In the embodiment of FIG. 5, a given row will only report a match to the priority encoder if its matchline row reports a match result and the row immediately below it reported a match result on the previous cycle. In the embodiment of FIG. 8, a "Search Next Up" instruction will permit the status and valid bits of a row above the row with a match to be set or reset.

A first wide word deletion method embodiment of the present invention for execution upon CAM array 200 of FIG. 5 follows. In this embodiment each word is deleted and purged sequentially. However multiple copies of the same word will be deleted at the same time. In the present embodiment, one status bit cell is used to mark a first word, and one or more bits, either data or status bit cells, of the first word are used to indicate the size of the wide word. The sequence is as follows:

1. Search for the first word segment(Valid, First, Wsize, Data)
2. Search Next Down for the subsequent n–2 word segments (Valid, Data)
3. Search Next Down and Delete for the final word segment (Valid, Data)
4. Search Next Up and Delete (Valid)
5. Repeat Step 4 for n–1 times
6. Search for all deleted word segments and set first and size bits.

With reference to FIG. 10, sequence steps 1 and 2 can be executed in step 500, sequence step 3 can be executed in step 502, and sequence steps 4 and 5 can be executed in step 504. Sequence step 6 is an optional array clean up step.

A practical example to illustrate the first wide word deletion method embodiment for execution by CAM array 200 of FIG. 5 follows with reference to Tables 1a to 1f shown in FIGS. 11 and 12. Table 1a shows a table of six words according to this embodiment. Status bit 2 is used to designate a first word segment and Status 1 is used to designate a first size bit and Status 0 is used to designate a second size bit. Row 0 contains a normal word of data A as indicated by the valid bit, the first bit and size bits. In this embodiment size bits "00" indicate a normal length word. Rows 1 to 4 contain a wide word made up of four word segments B, C, D, E. Row 1 contains the first word segment as indicated by the valid bit and the first word bit being high. It also contains the key "11" in the size entry fields and this indicates a wide word of length four. Note that the length encoding only requires that each different length be given a unique code. Rows 2, 3 and 4 contain intermediate word segments as their valid bits are set and the first bit is "0". The size bits for these rows are don't care states (indicated by a "X") and may be assigned by the user to represent other useful information. They may be used to extend the size bits to allow for a greater number of supported sizes. For example, in an alternate embodiment "00" in the size bits of the first word indicate a normal word, "01" indicate a 2 segment wide word, "10" a 4 segment wide word and "11" a continuing wide word with length data given in the status bits of a subsequent word segment. In that alternate embodiment a six segment wide word would be indicated by "11" in the first row's size bits and "00" in a subsequent rows size bits. An 8 segment wide word would be indicated by a "11" in the first row and "01" in the subsequent row. One skilled in the art can see that this method of identifying word sizes could be continued with size bits stored in multiple rows to allow word sizes of any length. Row 5 contains an empty word as indicated by the valid bit being low. Empty rows preferably have their size codes set to a single length entry.

Step 1 will be a search for Valid="1", Status 2="1", Status 1="1", Status 0="1" and data B. After the search the flip-flop in row 1 will be set to a "1" indicating that row 1 matched the search key. The first iteration of step 2 will search for the next word (linked down) with Valid="1", Status 2="0", Status 1 and 0 masked and data=C. After the search the flip-flop for row 2 will be high as row 2 matched the search key and row 1 was a match in the previous search. The flip-flop in row 1 will be set to "0" as it did not get a match on its match line. The next iteration of step 2 repeats this operation with data D.

Step 3 executes a search and delete for next word (linked down) with Valid="1", Status 2="0", Status 1 and 0 masked and data=E. As it is a search and delete command the V_SET0 input to the valid bit cell is set to the high logic state and the resulting match data in the flip-flop of row 4 sets the valid bit of row 4 to "0". Table 1b shows the table after step 3. Note that steps 1 to 3 will find and mark for deletion all words that match the given search parameters. Thus multiple copies of the same wide word may be deleted with the same instructions.

Table 1c shows the result of the first search next up and delete for a valid bit. Only the valid bit of location 3 is set to "0". Row 3 matches the search conditions and is the only row linked to the previous search that matched row 4. Similarly Table 1d shows the table after another iteration of step 4. Table 1e shows the data table after the last iteration of step 4. The system controller knows that it is deleting a four word segment wide word so it only issues three commands of the type indicated in step 4.

Table 1f shows the data table after the cleanup, or purge, of step 6. All the deleted words are set to a known state of single entry empty words. Step 6 is not required but its execution is preferred. Step 6 may be delayed until after multiple deletions of wide words (repetitions of steps 1 to 5). This methodology allows the user to efficiently delete all wide words. For example if there are 100 unique wide words each consisting of 4 words to be deleted this will take 701 cycles and guarantees that all copies of each word will be deleted.

A second wide word deletion method embodiment of the present invention for execution upon CAM array 200 of FIG. 5 follows. In the present embodiment, one status bit is used to mark a first word and a second status bit is used to mark a last word. The sequence to delete entries in this embodiment is as follows:

1. Search for the first word segment (Valid, First, Data)
2. Search Next Down for the subsequent n–2 word segments (Valid, Data)
3. Search Next Down and Delete for the last word segment (Valid, Data)
4. Search for deleted last word segments and clear last bit (not Valid, not first and last)
5. Search Next Up for valid and not first and reset Valid,
6. Repeat step 5 m times where m>=largest n–1 to be purged
7. Search for all deleted word segments and reset all status bits.

With reference to FIG. 10, sequence steps 1 and 2 can be executed in step 500, sequence step 3 can be executed in step 502, and sequence steps 4 to 6 can be executed in step 504. Sequence step 7 is an optional array clean up step. Note that the process can be interrupted between steps 3 and 4 and searches for other wide words can be executed. Therefore word segments of multiple wide words can be deleted once the process resumes at step 4. Steps 4 and 5 will delete all wide word segments in a CAM. This methodology allows the user to efficiently delete all wide words. For example if there are 100 wide words each consisting of four word segments to be deleted, this will take at least 405 cycles and guarantees that all copies of a wide word will be deleted.

A practical example to illustrate the second wide word deletion method embodiment for execution by CAM array 200 of FIG. 5 follows with reference to Tables 2a to 2g shown in FIGS. 13 and 14. Table 2a shows a table of six words according to this embodiment. Status 2 is used to designate a first word and Status 1 is used to designate a last word. Status 0 is a don't care state as indicated by a "X". This bit can be assigned by the system to represent any function. Row 0 contains a normal word of data A as indicated by the valid bit, the first bit and the last bit. Rows 1 to 4 contain a wide word made up of four word segments B, C, D, E. Row 1 contains the first word segment as indicated by the valid bit and the first word bit being high. Rows 2 and 3 contain intermediate word segments as their valid bits are set and neither of the first nor last bits is set. Row 4 contains the last word segment as the valid and last bits are set. Row 5 contains an empty word as indicated by the valid bit being low and the first and last bits being high.

Step 1 will be a search for Valid="1", Status 2="1", Status 1="0", Status 0 masked and Data=B. After the search the flip-flop in row 1 will be set to a "1" indicating that row 1 matched the search key. The first iteration of step 2 will search for the next word segment (linked down) with Valid="1", Status 2="0", Status 1="0", Status 0 masked and Data=C. After the search the flip-flop for row 2 will be high as row 2 matched the search key and row 1 was a match in the previous search. The flip-flop in row 1 will be set to "0" as it did not get a match on its match line. The next iteration of step 2 repeats this operation with data D.

Step 3 does a search and delete for next word segment (linked down) with Valid="1", Status 2="0", Status 1="1", Status 0 masked and data=E. As it is a search and delete command the V_SET0 input to the valid bit cell is high and the resulting match data in the flip-flop of row 4 sets the valid bit of row 4 to "0". Table 2b shows the table after step 3.

Step 4 will be a search for rows with Valid="0", Status 2="0" (not first word) and Status 1="1" (last word) with S1_SET0 high. Note that S1_SET0 is equivalent to signal S_SET0, but connected only to status bit cell 1. All other bits are masked. Table 2c shows the table after step 4. Note that the flip-flop in row 4 will hold a "1" as it matched the search key. This search key will find deleted last word segments of a wide word such as row 4 but not find deleted words such as row 5. Table 2d shows the result of the first search next up and delete for valid and not first search key (Valid="1", Status 2="0", all others masked). Only the valid bit of location 3 is set to "0". Row 3 matches the search conditions and is the only row linked to the previous search that matched row 4. Similarly Table 2e shows the table after another iteration of step 5.

After another iteration of step 5 the table looks like that of Table 2f. Another iteration of step 5 will not effect the table as the search is looking for Status 2="0". Status 2 of row 1 is a "1" and thus no match will be generated. Elsewhere in the CAM there could be wide words of six or eight words that are being deleted by the subsequent iterations of step 5.

Step 7 is the purge, or cleanup step, that sets all empty locations to be an empty normal word.

A third wide word deletion method embodiment of the present invention for execution upon CAM array 400 of FIG. 8 follows. In the present embodiment, one status bit is used to mark a first word segment and one or more bits (either CAM data cells or status bit cells) of the first word segment are used to indicate the size of the wide word. The sequence is as follows:

1. Search for the first word segment (Valid, First, Wsize, Data)
2. Search Next Down for the subsequent n−2 word segments (Valid, Data)
3. Search Next Down and Delete for the final word segment (Valid, Data)
4. Search for Deleted not first word segments (not Valid, not first) and reset Valid for the row above
5. Repeat step 5 m times where m>=largest n−2 to be purged
6. Search for all deleted words and reset all status bits.

With reference to FIG. 10, sequence steps 1 and 2 can be executed in step 500, sequence step 3 can be executed in step 502, and sequence steps 4 to 5 can be executed in step 504. Step 6 is optional clean up step. Note that the process can be interrupted between steps 3 and 4 and searches for other wide words can be executed. Therefore word segments of multiple wide words can be deleted once the process resumes at step 4. Steps 4 and 5 will clear all deleted wide word entries in a CAM simultaneously. This methodology allows the user to efficiently delete all wide words. For example if there are 100 unique wide words each consisting of four word segments to be deleted, this will take 404 cycles. It will take four cycles to find and mark the last word segment as being invalid for each wide word. It will then take one cycle to find all invalid not first word segments and to delete the next word segment above them, and two more cycles to clear the rest of the word segments. One cycle is used to reset all first word bits. A practical example to illustrate the third wide word deletion method embodiment for execution by CAM array 400 of FIG. 8 follows with reference to Tables 3a to 3g shown in FIGS. 15 and 16. Table 3a shows a table of six words according to this embodiment, with the same data arrangement as that of Table 1a. The first three steps are the same as that for the first specific sequence, and Table 3b shows the same logic states as Table 1b.

Step 4 takes advantage of the ability to set the status bits of the row above. Step 4 searches for all deleted not first word segments (Valid="0" and Status 2="0", other status and data bits masked) and sets the valid bit cell of the row above to "0". Signal PUEN* is set to the low logic state and V_SET0 is set to the high logic state. This sets the valid bit of row 3 to "0". Table 3c shows the state of the table after one iteration of step 4.

The next iteration of step 4 results in the table shown in Table 3d. Another iteration of step 4 will result in the table of 3e. Further iterations of step 4 will not effect the current table as the search is looking for Status 2="0" and row 1 has Status 2="1". However there could be wide words of six or eight words elsewhere in the CAM that need to be deleted.

Step 6 is a clean up step that searches for Valid="0", all others masked and sets Status 2 to "1", Status 1 to "0" and Status 0 to "0". This sets all deleted words to empty words of normal length.

A fourth wide word deletion method embodiment of the present invention for execution upon CAM array 400 of FIG. 8 follows. In the present embodiment, one status bit is used to mark a first word segment and a second status bit is used to mark a word segment scheduled for purging. One or more bits (either data or status) of the first word segment are used to indicate the size of the wide word. The sequence is as follows:

1. Search for the first word segment (Valid, First, Wsize, Data)
2. Search Next Down for the subsequent n−2 word segments (Valid, Data)

3. Search Next Down and Delete and set Purge bit for the final word segment (Valid, Data)
4. Search for word segments with not valid, not first and purge bits set and reset the valid bit and set the purge bit of the row above
5. Repeat step 4 m times where m>=largest n−2 to be purged
6. Search for all deleted word segments and reset all status bits.

With reference to FIG. 10, sequence steps 1 and 2 can be executed in step 500, sequence step 3 can be executed in step 502, and sequence steps 4 to 5 can be executed in step 504. Step 6 is an optional array clean up step. This methodology allows the user to efficiently delete all wide words. For example if there are 100 unique wide words each consisting of four word segments to be deleted this will take 404 cycles and guarantees that all copies of a wide word will be deleted.

A practical example to illustrate the fourth wide word deletion method embodiment for execution by CAM array 400 of FIG. 8 follows with reference to Tables 4a to 4f shown in FIGS. 17 and 18. Table 4a shows a table of six words according to this embodiment. Status 2 is still the first bit but Status 1 is the purge marker. Status 0 is a don't care state and may be used by the system for any other purpose. The word size is stored in the first two bits of data.

Row 0 contains a normal word of data A as indicated by the first and valid bits being set high. The first two bits of data A are used to encode the word size "00". These word size data bits may either be provided by reducing the number of bits stored or by increasing the number of bits stored. Alternatively additional status bits can be added. Rows 1 to 4 contain a wide word made up of four word segments B, C, D and E. Row 1 contains the first word segment as indicated by the valid bit and the first bit being high, and the purge bit is low. Rows 2, 3 and 4 contain subsequent word segments as shown by the valid bits being set high and the first word bits being set low. Row 5 contains an empty word as indicated by the valid bit being low.

Step 1 will be a search for Valid="1", Status 2="1", Status 0 and 1 masked and data=11B. After the search the flip-flop in row 1 will be set to a "1" indicating that row 1 matched the search key. The first iteration of step 2 will search for the next word segment (linked down) with Valid="1", Status 2="0", Status 1 and 0 masked and data=C. After the search the flip-flop for row 2 will be high as row 2 matched the search key and row 1 was a match in the previous search. The flip-flop in row 1 will be set to "0" as it did not get a match on its match line. The next iteration of step 2 repeats this operation with data D.

Step 3 is a search next down and delete and set status 1 command with the search key of Valid="1", Status 2="0", Status 0 and 1 masked and Data=E. The output of the flip-flop in row 4 is high after the search and the V_SET0 and the S1_SET1 signals are set to the high logic state as part of the command. This sets the valid bit to low and the Status 1 to high in row 4. This is shown in Table 4b.

Step 4 takes advantage of the ability to set the status bits of the row above. Step 4 searches for Valid="0", Status 2="0", Status 1="1", status 0 and data masked. Signal PUEN* is set to the low logic state and V_SET0 and S1_SET1 are set to the high logic state. This sets the valid bit of row 3 to "0" and the Status 1 of row 3 to "1". This is shown in Table 4c. The next iteration of step 4 results in the table shown in Table 4d. Another iteration of step 4 will result in the table of 4e. Further iterations of step 4 will not effect the current table as the search is looking for Status 2="0" and row 1 has Status 2="1". However there could be wide words of six or eight word segments elsewhere in the CAM that need purging.

Step 6 is a clean up step that searches for Valid="0", Status 1="1", all others masked and sets Status 2 to "1" and Status 1 to "0". This sets all deleted words to empty words.

It is noted that the third and fourth wide word deletion method embodiments are tailored for execution upon CAM array 400 of FIG. 8 because CAM array 200 of FIG. 5 does not have the match processing circuitry that enables one row to set the control bits of an adjacent row.

The aforementioned method and examples for searching and deleting wide words from CAM arrays 200 and 400 assume that wide words and their corresponding status and valid bit cells already have data written to them. Writing word segments is accomplished with standard memory write operations whereby a wordline is activated and bitlines are driven with data to be written. Before the status bit cells can be used, they are set to known states during power up phases of the CAM device by asserting the S_SET[1:0] and V_SET [1:0] signals. When storing, or writing, the first word segment of a wide word to CAM array 200 or 400, one status bit can be set to be a first word flag bit. Hence if the current word segment being written is a first word of a wide word or a normal word, this first word flag bit will be set to the logic "1" state. If the word segment being written is a subsequent word in a wide word, it will be set to the logic "0" state. Other status or data bits can be assigned a value corresponding to the length of a word. The next write command will be to the next location, either up or down the CAM array. The valid bit cell for each written word segment will be set to the logic "1" state to indicate that the location contains valid data.

The previously described CAM array and methods of wide word deletion according to embodiments of the present invention, minimize the number of CAM operation cycles required for deleting wide words. This is achieved by limiting search and delete functions to the CAM array, such that there is no need to calculate match addresses with a priority encoder after each search cycle. According to the wide word deletion embodiments of the present invention, only 404 search cycles are required to delete 100 unique wide words, where each wide word consists of four word segments. As discussed earlier, the prior art CAM devices require at least 1200 cycles to delete 100 wide words, where each wide word consists of four word segments. Because about one third of the operation cycles are required for deleting words over the prior art CAM devices, the CAM devices employing the CAM arrays and methods of the present invention will have significantly improved performance since more time is available for the primary task of searching.

While the preferred embodiments of the present invention use three status bit cells and a single valid bit cell, any number of status bit cells and valid bit cells can be used in alternate embodiments. In other alternative embodiments, the AND, OR and MUX gates can be substituted with equivalent functional pass gates, and the status bit cell and valid bit cell set signals can be activated during any search cycle, including during the NORMAL SEARCH operation.

The above-described embodiments of the invention are intended to be examples of the present invention. Alterations, modifications and variations may be effected the particular embodiments by those of skill in the art, without departing from the scope of the invention which is defined solely by the claims appended hereto.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for deleting a wide word from a CAM memory array comprising:
   a) iteratively searching the CAM memory array for word segments of the wide word;
   b) marking only a last word segment of the wide word; and,
   c) deleting all word segments belonging to the wide word having the marked last word segment, where all the deleted word segments include both unmarked word segments and the marked last word segment.

2. The method of claim 1, wherein the step of iteratively searching includes passing latched search results from one row to an adjacent row in a first direction.

3. The method of claim 2, wherein the step of marking includes setting a valid bit associated with the last word segment of the wide word to a logic state indicative of invalid data.

4. The method of claim 3, wherein the step of deleting includes searching for the valid bit having the logic state indicative of invalid data.

5. The method of claim 4, wherein the step of searching for valid bits includes passing latched search results from one row to an adjacent row in a second direction opposite to the first direction.

6. A method for deleting a first wide word and a second wide word from a CAM memory array comprising:
   a) iteratively searching the CAM memory array for word segments of the first wide word and the second wide word;
   b) marking only last word segments of the first wide word and the second wide word; and,
   c) deleting in parallel all word segments belonging to the first wide word and the second wide word having the marked last word segments, where all the deleted word segments include both unmarked word segments and the marked last word segments.

7. The method of claim 6, wherein the first wide word and the second wide word are identical to each other, and the step of iteratively searching includes searching for word segments of the first wide word and the second wide word in parallel.

8. The method of claim 7, wherein the step of marking includes marking the last word segments of the first wide word and the second wide word in parallel.

9. The method of claim 6, wherein the step of iteratively searching includes searching for all copies of the first wide word in parallel, and the step of marking includes marking the last word segments of all copies of the first wide word in parallel.

10. The method of claim 9, wherein the step of iteratively searching further includes the step of marking the last word segments of all copies of the first wide word in parallel, searching for all copies of the second wide word in parallel and marking the last word segments of all copies of the second wide word in parallel.

11. A method for deleting a wide word from a CAM memory array comprising:
    a) iteratively searching the CAM memory array for all word segments of the wide word in a first direction; and,
    b) marking for deletion only a last word segment of the wide word, the wide word, including both unmarked word segments and the marked last word segment, being considered deleted when the last word segment is marked for deletion.

12. The method of claim 11, further including searching for the marked last word segment.

13. The method of claim 12, further including deleting all the word segments belonging to the wide word having the marked last word segment in a second direction, where all the deleted word segments include both unmarked word segments and the marked last word segments, the second direction being opposite to the first direction.

14. The method of claim 13, wherein the step of iteratively searching includes passing latched search results from one row to an adjacent row in the first direction.

15. The method of claim 14, wherein the step of marking includes setting a valid bit associated with the last word segment of the wide word to a logic state indicative of invalid data.

16. The method of claim 15, wherein the step of searching includes searching for the valid bit having the logic state indicative of invalid data.

17. The method of claim 16, wherein the step of searching for valid bits includes passing latched search results from one row to an adjacent row in the second direction.

* * * * *